United States Patent [19]

Ngan et al.

[11] Patent Number: 5,378,660
[45] Date of Patent: Jan. 3, 1995

[54] BARRIER LAYERS AND ALUMINUM CONTACTS

[75] Inventors: Kenny K. Ngan, Fremont; Edith Ong, Saratoga, both of Calif.

[73] Assignee: Applied Materials, Inc., Santa Clara, Calif.

[21] Appl. No.: 17,081

[22] Filed: Feb. 12, 1993

[51] Int. Cl.$^6$ .................... H01L 21/324; H01L 21/44; C23C 14/00

[52] U.S. Cl. .................... 437/247; 437/192; 204/192.15; 204/192.17; 204/192.22; 204/192.25; 148/DIG. 3

[58] Field of Search ........ 204/192.12, 192.15, 204/192.16, 192.17, 192.21, 192.22, 192.25, 298.25, 298.26; 437/192, 200, 247, 248; 148/DIG. 3, DIG. 147

[56] References Cited

U.S. PATENT DOCUMENTS

| | | | |
|---|---|---|---|
| 4,724,060 | 2/1988 | Sakata et al. | 204/192.12 |
| 4,784,973 | 11/1988 | Stevens et al. | 437/192 |
| 4,920,073 | 4/1990 | Wei et al. | 437/200 |
| 4,951,601 | 8/1990 | Maydan et al. | 118/719 |

FOREIGN PATENT DOCUMENTS

| | | | |
|---|---|---|---|
| 1275332 | of 0000 | Canada | 356/184 |
| 2-119129 | 5/1990 | Japan | 437/192 |

OTHER PUBLICATIONS

Park et al, "AL-PLAPH ..." IEEE VMIC Conf. pp. 326–328.

Nulman et al "Titanium Silicide and Titanium Nitride Layers ..." IEEE 1991 Multilayer Inconnect Conf. Jun. 11–13.

Osburn, Derwent Abs. 007229892 RD2759002.

Primary Examiner—Robert Kunemund
Assistant Examiner—Rodney McDonald
Attorney, Agent, or Firm—Birgit E. Morris

[57] ABSTRACT

In the manufacture of high temperature deposited aluminum contacts onto silicon substrates wherein a barrier layer of titanium nitride is used, the improvement wherein the titanium nitride contains oxygen. The improved contacts are made by depositing a titanium-containing layer onto a silicon substrate, performing a first, high temperature nitrogen anneal in vacuum to form a low resistance $TiSi_x$ contact to the silicon, and performing a second, lower temperature anneal in vacuum using a mixture of nitrogen and oxygen to add oxygen to the titanium nitride layer. This oxygen-containing titanium nitride layer provides an improved barrier to a subsequently deposited high temperature deposited aluminum layer.

16 Claims, 3 Drawing Sheets

BARRIER LAYERS AND ALUMINUM CONTACTS

This invention relates to improved aluminum contacts for microelectronic devices and method of making the same. More particularly, this invention relates to improved aluminum contacts deposited over a titanium-containing layer.

BACKGROUND OF THE INVENTION

In the manufacture of multilevel interconnects for integrated circuits, aluminum contacts have been deposited over nitrogen annealed titanium layers for several reasons. A titanium layer can be sputter deposited directly over bare silicon or polysilicon surfaces on integrated circuit substrates, and annealed at elevated temperatures. During the annealing step, the titanium reacts with the underlying silicon to form titanium silicide ($TiSi_x$), a low resistance material; when the titanium layer is annealed in the presence of nitrogen, it also reacts with the nitrogen to form a surface titanium nitride layer that acts as a barrier to an overlying aluminum contact. This TiN barrier layer prevents the aluminum from spiking through to the underlying silicon, which would short out devices in the silicon, and prevents the silicon and any dopants that are present in the semiconductor substrate from diffusing to the aluminum contact.

In an effort to improve the Ti/TiN barrier properties, a first layer of titanium has been deposited and a second layer of titanium nitride has been deposited thereover. The titanium-containing layers are then heated or annealed at high temperatures under nitrogen to form the $TiSi_x$ layer. The presence of nitrogen prevents the formation of oxide on the titanium nitride layer.

As the number of integrated circuit devices on a single silicon wafer has become larger, the devices themselves have become smaller and more densely packed, and the processing of individual devices becomes more critical. When aluminum is deposited into high aspect ratio openings or trenches in silicon, higher temperatures of deposition must be used to fill the trenches completely and to form a planarized surface. However, when high aluminum deposition temperatures are used, the prior art titanium nitride barrier layers are inadequate to prevent aluminum spiking through the titanium nitride layer.

Thus a means of improving aluminum contacts to provide stable, low resistance contacts to the underlying silicon substrate, to provide improved barrier properties in titanium-containing barrier layers, and to provide good flow and planarizing properties for overlying aluminum layers has been sought.

SUMMARY OF THE INVENTION

We have found that a two step annealing process for the titanium/titanium nitride layer provides stable, low resistance contacts to silicon and improved barrier properties to a titanium-containing layer that prevents spiking failures even when aluminum is deposited over the barrier layer at high temperatures, i.e., temperatures of over about 400° C. The two step annealing process of the invention provides a first, high resistance $TiSi_x$ contact, followed by a low temperature anneal temperature vacuum anneal of titanium in nitrogen to form a low in nitrogen containing a small amount of oxygen to form an improved titanium nitride barrier layer. The small amount of oxygen added during the second anneal step "stuffs" or adds oxygen to the titanium nitride layer, thereby improving its barrier properties to an overlying high temperature deposited aluminum layer. These annealing steps are carried out sequentially without removing the substrate from a high vacuum environment. Preferably the deposition of titanium, or a two layer titanium and titanium nitride layer, the two step anneal and aluminum deposition are carried out in an integrated high vacuum system so that all of the steps in making the aluminum contacts of the invention are carried out without removing the substrate from a vacuum environment.

DETAILED DESCRIPTION OF THE INVENTION

The present two step in situ titanium anneal process provides both a low resistance $TiSi_x$ ohmic contact to a silicon substrate, and an excellent barrier layer of $TiN_yO_z$ that serves to prevent diffusion of the underlying silicon and any dopants therein through the barrier layer, and also to prevent spiking of an overlying aluminum layer through the barrier layer, even when the aluminum layer is deposited at high temperatures of 400° C. and higher.

Figure 1:
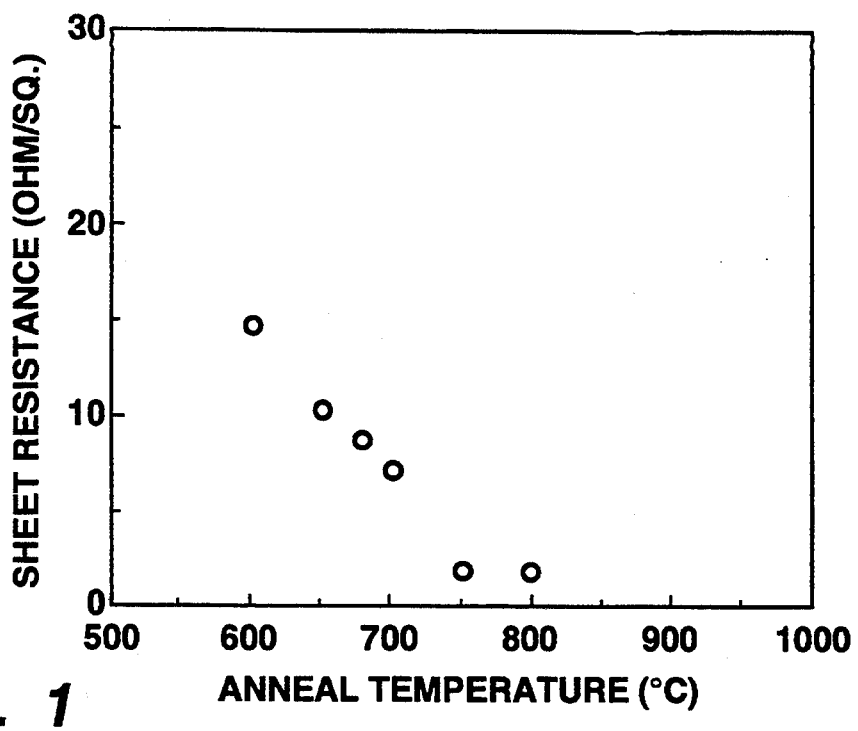
FIG. 1 is a graph of sheet resistance versus anneal temperature of a titanium silicide layer.

The present process comprises first sputter depositing a thin layer of titanium or a layer of titanium and a layer of titanium nitride over precleaned and exposed silicon areas of a silicon wafer. The exposed silicon areas can be of crystalline silicon or of polysilicon, and the silicon can contain various dopants therein, such as the source/drain regions of a transistor. The titanium layer is then annealed in nitrogen, under vacuum, at high temperatures of about 750°–850° C. This high temperature annealing step both reacts the titanium with the nitrogen to form an overlying titanium nitride barrier layer, and reacts the titanium in contact with the underlying silicon to form a titanium silicide layer, $TiSi_x$, which forms a low resistance ohmic contact to the silicon. Referring to FIG. 1, it can be seen that low sheet resistance of a titanium silicide layer is obtained at reaction temperatures between about 750°–800° C.

The temperature is then lowered in situ, and annealing is continued at a lower temperature of about 500°–550° C. in an atmosphere of nitrogen now containing a small amount of oxygen. This step forms an overlying "stuffed" or oxygen-containing titanium nitride layer, $TiN_yO_z$, which has improved barrier properties to an overlying aluminum layer.

The deposition of the titanium layer, the annealing steps and the deposition of aluminum are all carried out without removing the substrate from vacuum. For example, the present process can be carried out in a multichamber vacuum system as has been disclosed by Maydan et al in U.S. Pat. No. 4,951,601, which describes a plurality of vacuum chambers connected to a high vacuum transfer chamber, thereby allowing more than one processing step to be performed on a substrate without removing the substrate from vacuum. Such systems are coming into widespread use for VLSI and ULSI integrated circuits because the processing is more controllable and the number of contaminant particles that can adhere to a substrate are vastly reduced. Further, such systems are practical for single wafer processing, as opposed to batch-type processing, because little time is lost in transfers of the substrate from one chamber to another.

Figure 2:
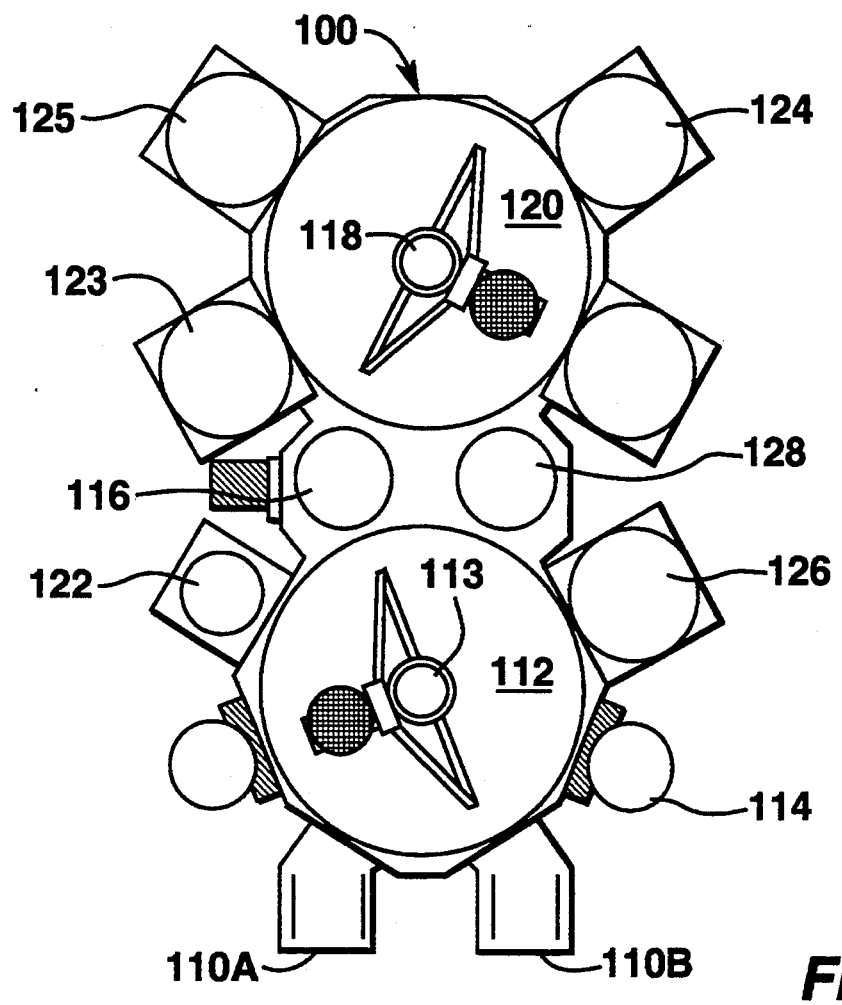
FIG. 2 is a plan view of an integrated vacuum system in which the present process can be carried out.

A suitable multi-chamber system for carrying out the present process is shown in FIG. 2. The system 100 of FIG. 2 includes two independently operated loadlock chambers 110A and 110B for loading and unloading substrates into a first transfer chamber 112 fitted with a planar, two axis magnetically coupled robot 113 for transfer of the substrates to various of the connected processing chambers. A degas chamber 114 removes surface contaminants using lamp heating, and an optional preclean chamber 116 can be used to sputter clean or plasma clean the incoming substrates and to remove native oxides from exposed silicon surfaces for example. The cleaned substrates are retrieved by a second robot 118 in a second transfer chamber 120 and are loaded into a first sputter deposition chamber 122 for sputter deposition of titanium. When the desired thickness (typically 30 nm) of titanium has been deposited, nitrogen is passed into the chamber 122. In the presence of argon about 800 angstroms of TiN is deposited. The substrate is transferred to chamber 126 where the temperature of the substrate is raised to about 750°–850° C. in the presence of nitrogen. This first anneal step allows the reaction of titanium with the exposed silicon areas on the substrate to form a low resistance ohmic contact of $TiSi_x$ over the silicon.

The substrate is then cooled in the same chamber 126 to a temperature of about 550° C. and a small amount of oxygen, e.g., about 3–15% by volume, and preferable about 5–10% by volume, is added to the nitrogen. This second, low temperature anneal step stuffs or adds oxygen to the TiN layer and provides an improved barrier layer of $TiN_yO_z$ that can prevent a subsequently deposited, high temperature aluminum layer from spiking through the barrier layer to the $TiSi_x$ contact or underlying silicon layer.

After annealing, the substrate is transferred from the anneal chamber 126 to a first, cold aluminum deposition chamber 125 and then to a high temperature aluminum deposition chamber 124 where aluminum is deposited over the barrier layer.

Alternately, after annealing in the chamber 126, the substrate can be transferred to the chamber 123 to deposit a titanium wetting layer followed by deposition of the cold aluminum layer in the chamber 125 and the high temperature deposited aluminum layer in chamber 124 as detailed above.

The substrate can be cooled in a separate cool down chamber 128 and finally transferred to a load lock chambers 110A or 110B for transfer out of the system 100.

Although the pressure in the system 100 can vary somewhat between the buffer chamber and the transfer chamber, and from one processing chamber to another, the pressure in the system remains at about $10^{-6}$ millitorr or less, and thus the substrate is never removed from a high vacuum environment during formation of the present contacts.

As is known, additional chambers for carrying out additional etch or deposition steps, heat treatment and the like can be added to the system 100. The great advantage of the system 100 is that it can accommodate multiple step sputtering processes in which various layers may be deposited sequentially, all without leaving a high vacuum environment. This constitutes a great advance in the art of processing wafers one at a time because the substrates do not need to be reconditioned for each sputtering step. In addition, the preservation of process control enhances process flexibility for throughput optimization. Further it has been found that the use of such equipment ensures better control of film quality which may have potential impact on the electromigration and other device performance properties.

Figure 3:
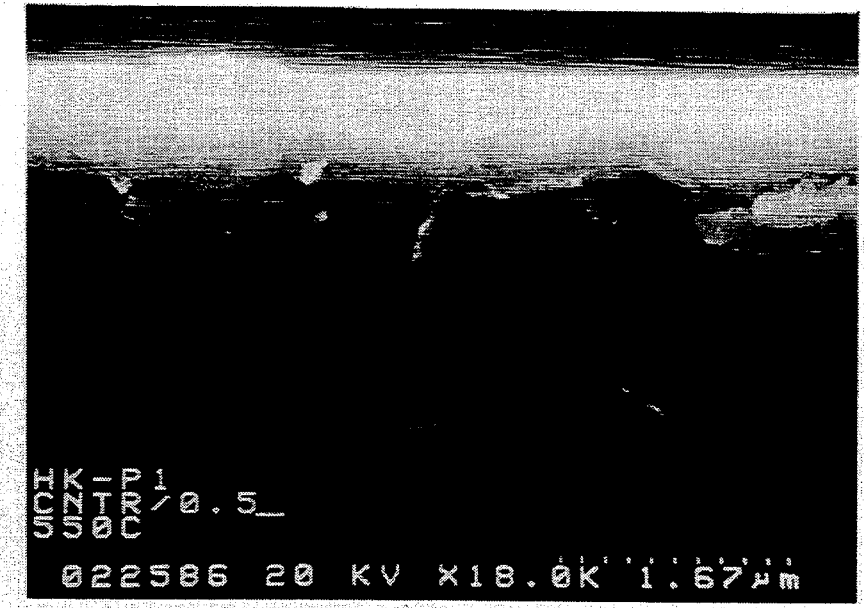
FIG. 3 is a photomicrograph of an aluminum contact made according to a prior art process.
Figure 4:
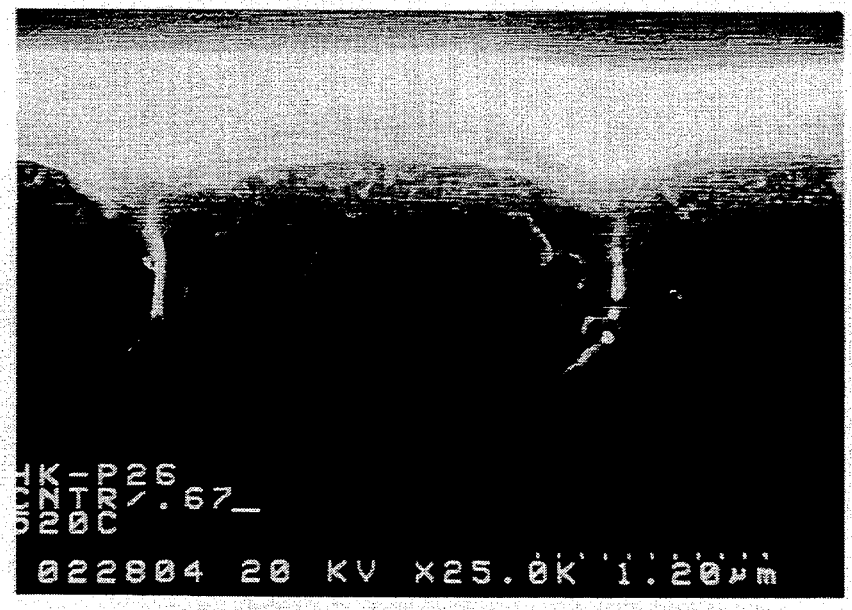
FIG. 4 is a photomicrograph of an aluminum contact made in accordance with the process of the invention.

The improved contacts of the present invention can be illustrated by referring to FIGS. 3 and 4. FIG. 3 is a photomicrograph of a contact made by the prior art process and FIG. 4 is a photomicrograph of a contact made in accordance with the present process. These contacts were made as detailed hereinbelow.

Aluminum contacts were made in high aspect ratio holes in several silicon substrates.

A conventional process was used to sputter deposit about 500 angstroms of titanium (Table I) and about 300 angstroms of titanium and about 800 angstroms of titanium nitride (Table II). A single step anneal for 30 seconds in nitrogen at 750°–900° C. was carried out to form the titanium silicide contact and the titanium nitride barrier layer. Aluminum was then deposited via a conventional sputter deposition process. The stacked films then underwent a conventional aluminum alloy cycling. Contact resistance and leakage current were determined and found to be acceptable. Thus, as can be seen in Tables I and II below, good contact resistance and leakage current were obtained with this process.

TABLE I

| Temperature, °C. | Leakage Current, pA | Leakage current, 1s. pA |
| --- | --- | --- |
| 750 | 12900.0 | 200.0 |
| 800 | 620 | 65.0 |
| 850 | 475 | 45.0 |

TABLE II

| Temperature, °C. | Leakage Current, pA | Leakage current, 1s. pA |
| --- | --- | --- |
| 600 | 269.0 | 94.0 |
| 650 | 428.0 | 29.0 |
| 700 | 585.0 | 30.0 |
| 750 | 463.0 | 112.0 |
| 800 | 533.0 | 51.0 |
| 850 | 351.0 | 30.0 |

Using the above prior art titanium and titanium nitride deposition and annealing process, aluminum was then deposited at a temperature of over 400° C. over the annealed titanium nitride layer. As can be seen in the photomicrograph of FIG. 3, junction spiking occurred with this contact. Thus the prior art process is inadequate to prevent junction spiking when aluminum is deposited at high temperatures.

Following the procedure of the invention, sequential titanium and titanium layers were sputter deposited in an integrated vacuum system as in FIG. 2. A high temperature anneal (750°–850° C.) in nitrogen to form the titanium silicide contact was followed by a lower temperature (500°–550° C. anneal in a mixture of nitrogen containing 3–15% by volume of oxygen. The resultant stuffed titanium nitride layer formed an excellent barrier to a high temperature (>400° C.) deposited aluminum layer. As can be seen in the photomicrograph of FIG. 4, no junction spiking occurred with the contact made in accordance with the process of the present invention.

The two step anneal process of the invention during the first high temperature anneal step in pure nitrogen atmosphere provides an excellent low resistance $TiSi_x$ contact over the first high temperature anneal step in pure nitrogen atmosphere silicon substrate. As can be seen in FIG. 1, at 800° C. a sheet resistivity of only about 2.0 ohms/sq was obtained.

Table III below illustrates the changes in sheet resistance with anneal temperature following the process of the invention.

TABLE III

| Temperature, °C. | $O_2/N_2$, % | $R_s$ Ti/TiN, ohms/sq |
|---|---|---|
| 400 | 0 | 11.6 |
| 400 | 5 | 11.3 |
| 400 | 20 | 11.6 |
| 500 | 0 | 11.3 |
| 500 | 5 | 11.7 |
| 600 | 0 | 9.3 |
| 600 | 5 | 10.8 |
| 700 | 0 | 8.8 |
| 700 | 5 | 72.2 |
| 800 | 0 | 8.3 |
| 800 | 5 | 185.8 |
| 800 | 20 | infinite |

The second, low temperature anneal in a nitrogen atmosphere containing oxygen improves the barrier properties of the titanium nitride layer to an overlying aluminum layer.

Figure 5:
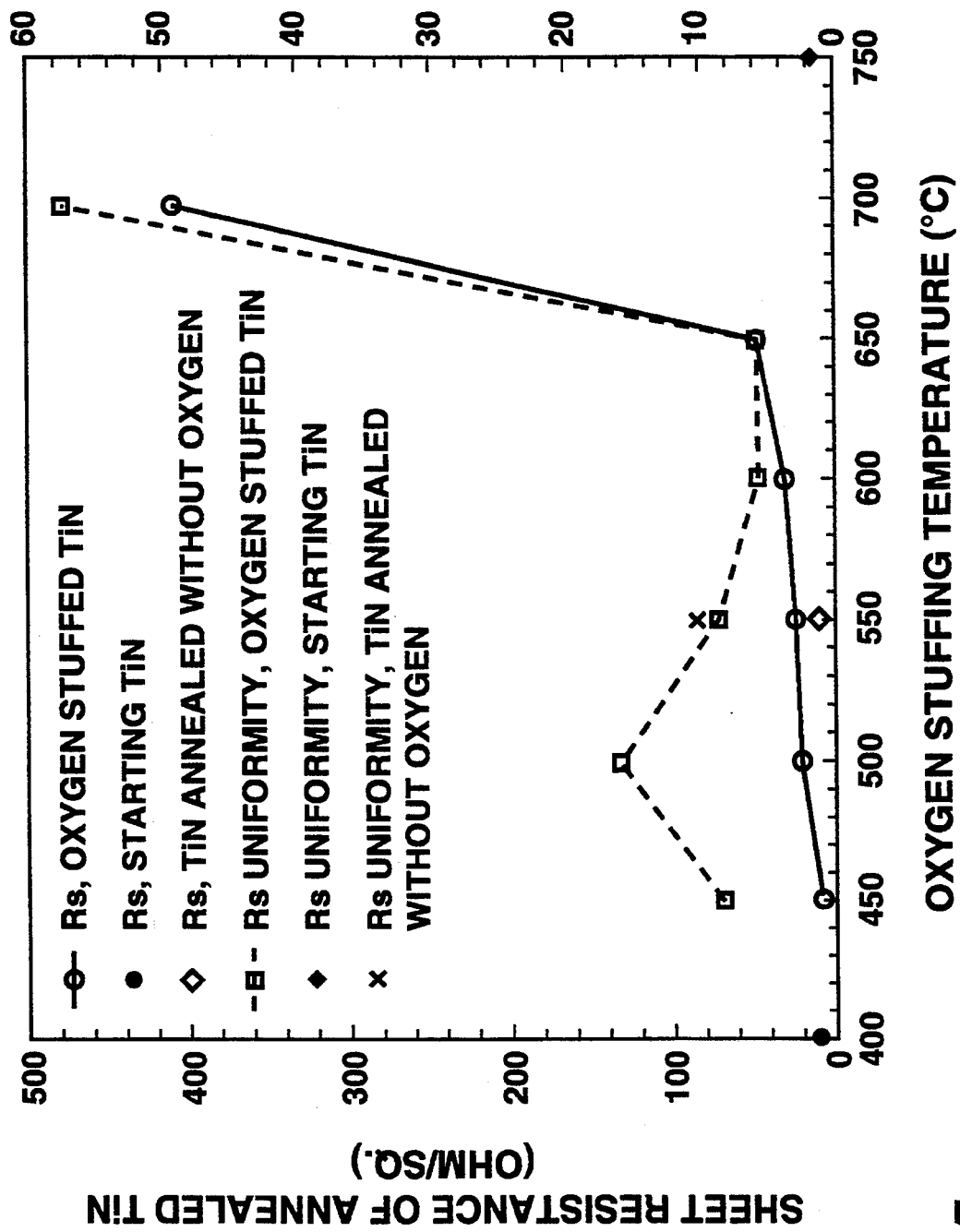
FIG. 5 is a graph of sheet resistance versus anneal temperature of a stuffed titanium nitride layer.

FIG. 5 is a graph illustrating the change in sheet resistance and sheet resistance uniformity versus temperature of the second anneal step. A 600 angstrom thick titanium nitride layer was exposed to a mixture of nitrogen containing 15% by volume of oxygen for 30 seconds. The pressure of the chamber was 10 Torr.

Referring to Table III and FIG. 5, if too high a temperature is employed in the oxygen-containing anneal, i.e., over 650° C., the sheet resistance increases. If the oxygen content is too high, e.g., 20% by volume of the nitrogen, again the sheet resistance is too high. Thus by careful adjustments of both the temperature and the oxygen content for the second anneal step of the present process, both a good contact and a good high temperature titanium nitride barrier layer are obtained.

Although titanium alone can be sputter deposited and titanium nitride formed therefrom by annealing in nitrogen, preferably the present contacts are made by sputter depositing a first titanium layer and a second titanium nitride layer on the substrate. When titanium and titanium nitride are deposited sequentially, a contact having more controllable properties and a more controllable process results. Thus preferably a first titanium layer is sputter deposited onto the silicon substrate and a second titanium nitride layer is sputter deposited thereover, either in the same chamber or in two connected chambers of an integrated vacuum processing system. The annealing steps can be carried out in the same chamber or in two separate chambers. In any event, what is important is that the substrate be kept in a vacuum environment through all of the contact preparation steps, including the aluminum deposition step and aluminum anneal if employed. This reduces the chance of contamination of the substrates, particularly to unwanted oxygen.

A collimation grating can be used in conjunction with the titanium/titanium nitride/aluminum depositions, as is known. The use of a collimation grating improves deposition of the various layers on the bottom of vias and openings to be filled, particularly when such openings have a high aspect ratio, i.e., 1.5 or higher. The use of a collimation grating improves the directionality of the sputtered ions to improve coverage at the bottom of openings or vias.

The above steps and embodiments of the present invention are meant to be illustrative only, and various changes can be made to the present process as will be known to those skilled in the art, and are meant to be included herein. The present invention is only to be limited by the scope of the appended claims.

What is claimed is:

1. A method of forming a titanium nitride barrier layer which comprises the following steps in sequence
   a) depositing a titanium-containing layer on a substrate in a vacuum environment;
   b) annealing said layer in nitrogen under vacuum at a temperature of from about 750°–850° C.; and
   c) annealing said layer in nitrogen containing from about 3–15% by volume of oxygen under vacuum at a temperature of from about 500°–550° C. without removing the substrate from vacuum.

2. The method according to claim 1 wherein from about 5–10% by volume of oxygen is added in step c).

3. The method according to claim 1 wherein said titanium-containing layer comprises a first layer of titanium and a second layer of titanium nitride.

4. The method according to claim 1 wherein said titanium-containing layer is sputter deposited.

5. The method according to claim 3 wherein said titanium-containing layer is sputter deposited.

6. The method according to claim 4 wherein said titanium-containing layers are sputter deposited through a collimation grating.

7. A method according to claim 5 wherein said titanium-containing layers are sputter deposited through a collimation grating.

8. A method of forming an aluminum contact on a silicon substrate comprising the following steps in sequence:
   a) sputter depositing a titanium-containing layer over said silicon under vacuum;
   b) annealing said titanium-containing layer in nitrogen under vacuum at a temperature of from about 750°–850° C., thereby forming a titanium silicide interface;
   c) annealing said titanium-containing layer under nitrogen containing from about 3–15% by volume of oxygen under vacuum at a temperature of from about 500°–550° C., thereby forming an oxygen-containing titanium nitride layer without removing the substrate from vacuum; and
   d) sputter depositing an aluminum layer over the stuffed titanium nitride layer at a temperature of over about 400° C.

9. The method according to claim 8 wherein from about 5–10% by volume of oxygen is present in step c).

10. The method according to claim 8 wherein said titanium-containing layer comprises a first layer of titanium and a second layer of titanium nitride.

11. The method according to claim 8 wherein said titanium-containing layer is sputter deposited.

12. The method according to claim 10 wherein said titanium-containing layers are sputter deposited.

13. The method according to claim 11 wherein said titanium-containing layer is sputter deposited through a collimation grating.

14. The method according to claim 12 wherein said titanium-containing layers are sputter deposited through a collimation grating.

15. The method according to claim 8 wherein said aluminum layer is sputter deposited at a temperature of over about 400° C.

16. The method according to claim 8 wherein all of steps a) to d) are performed without removing the substrate from vacuum.

* * * * *